United States Patent
Sheng et al.

(10) Patent No.: US 12,302,740 B2
(45) Date of Patent: May 13, 2025

(54) LASER-SINTERED PEROVSKITE SOLAR CELL AND MANUFACTURING METHOD

(71) Applicant: HUBEI WONDER SOLAR ENERGY CO., LTD., Wuhan (CN)

(72) Inventors: Yusong Sheng, Wuhan (CN); Dang Xu, Wuhan (CN)

(73) Assignee: HUBEI WONDER SOLAR ENERGY CO., LTD., Wuhan (CN)

( * ) Notice: Subject to any disclaimer, the term of this patent is extended or adjusted under 35 U.S.C. 154(b) by 0 days.

(21) Appl. No.: 18/335,976

(22) Filed: Jun. 15, 2023

(65) Prior Publication Data

US 2024/0196720 A1    Jun. 13, 2024

(30) Foreign Application Priority Data

Dec. 13, 2022 (CN) .......................... 202211602197.7

(51) Int. Cl.
*H10K 71/40* (2023.01)
*H10K 30/40* (2023.01)
*H10K 30/50* (2023.01)

(52) U.S. Cl.
CPC ........... *H10K 71/421* (2023.02); *H10K 30/40* (2023.02); *H10K 30/50* (2023.02)

(58) Field of Classification Search
CPC ........ H10K 30/15; H10K 30/30; H10K 30/40; H10K 30/50; H10K 30/81; H10K 30/85
See application file for complete search history.

(56) References Cited

U.S. PATENT DOCUMENTS

| | | | |
|---|---|---|---|
| 9,403,323 B2 | 8/2016 | Seeler et al. | |
| 10,707,807 B2 | 7/2020 | Jacques | |
| 10,999,934 B2 | 5/2021 | Lee et al. | |
| 2020/0044239 A1* | 2/2020 | Yu | H01M 4/625 |

OTHER PUBLICATIONS

Baker et al., "High throughput fabrication of mesoporous carbon perovskite solar cells", Journal of Materials Chemistry A, vol. 5, No. 35, Jan. 1, 2017 (Jan. 1, 2017), pp. 18643-18650.*
Chen et al., "Ultrafast and Scalable Laser-Induced Crystallization of Titanium Dioxide Films for Planar Perovskite Solar Cells", Solar RRL, vol. 5, No. 1, Dec. 6, 2020 (Dec. 6, 2020).*
Feleki et al., "Rapid and low temperature processing of mesoporous TiO2 for perovskite solar cells on flexible and rigid substrates", Materials Today Communications 13 (2017) 232-240.*

* cited by examiner

*Primary Examiner* — Golam Mowla
(74) *Attorney, Agent, or Firm* — True Shepherd LLC; Andrew C. Cheng (57) ABSTRACT

The present disclosure provides a laser-sintered perovskite solar cell and a manufacturing method thereof. The method includes: forming a hole blocking layer on a conductive base substrate; forming a mesoporous nanocrystalline layer on the hole blocking layer, and sintering the mesoporous nanocrystalline layer through a laser beam; forming an insulation interlayer on the mesoporous nanocrystalline layer; forming a counter electrode layer on the insulation interlayer, and sintering the insulation layer and the counter electrode layer; and applying a perovskite precursor solution on the counter electrode layer to obtain the laser-sintered perovskite solar cell.

7 Claims, 4 Drawing Sheets

LASER-SINTERED PEROVSKITE SOLAR CELL AND MANUFACTURING METHOD

CROSS-REFERENCE TO RELATED APPLICATIONS

This application claims priority to Chinese Patent Application No. 202211602197.7 with a filing date of Dec. 13, 2022. The content of the aforementioned application, including any intervening amendments thereto, is incorporated herein by reference.

TECHNICAL FIELD

The present disclosure relates to the manufacture of a solar cell, in particular to a laser-sintered perovskite solar cell and a manufacturing method.

BACKGROUND

For a mesoscopic perovskite solar cell, i.e., a solar cell with an organic metal halide of perovskite type as a light-absorbing material, its working principle will be described generally as follows. At first, a solar ray passes through glass and a conductive base film into the cell. Next, photons are absorbed by the light-absorbing material to form excitons. Dissociation energy needs to be provided for the dissociation of the excitons, so a part of the excitons are excited to generate electron-hole pairs, so as to generate free carriers. The electrons move through a perovskite layer into a mesoporous nanocrystalline layer, and are finally collected at the conductive base film. The holes are introduced through the perovskite material and then collected by a counter electrode layer. Finally, voltages are generated at two ends of the cell through the transmission and transfer of the carriers, and a current is generated by an external circuit.

Currently, the mesoscopic perovskite solar cell is manufactured as follows. A hole blocking layer is coated on a conductive glass substrate. Next, the mesoporous nanocrystalline layer, an insulation interlayer and the counter electrode layer are printed on the hole blocking layer. Then, a desired mesoporous structure is obtained in each film layer through high-temperature sintering. Finally, a perovskite precursor solution is dripped onto a surface of the counter electrode layer and enters the mesoporous structures inside the cell due to a capillary effect, so as to achieve the perovskite crystallization and obtain the solar cell.

During the preparation, the mesoporous structure is obtained through high-temperature sintering, and there exist many limitations in a current process for forming the mesoporous structure in a thin film. Taking a mesoscopic nanocrystalline layer made of titanium dioxide as an example, merely such organic components as pore-forming agent and solvent are removed through a conventional high-temperature heating-stage sintering, and a high-quality lattice connection fails to be formed between titanium dioxide grains. The thin film needs to be sintered for a long time period at a high temperature so as to obtain the desired mesoporous structure, resulting in large power consumption, low efficiency, and a long time period for increasing and decreasing a temperature in a sintering furnace. In addition, a stable temperature needs to be maintained within a long time period during the high-temperature sintering, so a processing environment is highly required. However, it is difficult to maintain an absolutely stable temperature, and the thin film is heated unevenly due to any fluctuation in the temperature during the annealing, so an internal stress is generated in the thin film and the reproducibility of the solar cell will be adversely affected. Furthermore, the thin film itself readily reacts with water and oxygen in the air, especially in a long-time high-temperature state, so the efficiency of the solar cell will be greatly adversely affected. When the solar cell is provided with a larger area, these problems become more apparent. Hence, there is an urgent need to solve these problems, so as to achieve the massive production of the mesoscopic perovskite solar cells.

SUMMARY

An object of the present disclosure is to provide a laser-sintered perovskite solar cell and its manufacturing method, so as to achieve the lattice connection between the titanium dioxide grains in a better manner through high-energy laser beams, create an electrical interconnection structure between the gains, improve the transfer of the carriers, and provide the thin film with a mesoporous structure through eliminating such organic components as solvent and binding agent in a slurry, thereby to solve the problems in the related art where the thin film is sintered for a long time period at large power consumption and low preparation efficiency, the processing environment is highly required, the reproducibility is poor and there is serious charge recombination.

In order to solve the above-mentioned problems, the present disclosure provides the following technical solutions.

In one aspect, the present disclosure provides in some embodiments a method for manufacturing a laser-sintered perovskite solar cell, including: forming a hole blocking layer on a conductive base substrate; forming a mesoporous nanocrystalline layer on the hole blocking layer, and sintering the mesoporous nanocrystalline layer through a laser beam; forming an insulation interlayer on the mesoporous nanocrystalline layer; forming a counter electrode layer on the insulation interlayer, and sintering the insulation layer and the counter electrode layer; and applying a perovskite precursor solution on the counter electrode layer to obtain the laser-sintered perovskite solar cell.

In a possible embodiment of the present disclosure, the mesoporous nanocrystalline layer is sintered through one of an ultraviolet laser, an infrared laser or a visible-light laser.

In a possible embodiment of the present disclosure, a wavelength of the laser beam is 0.35 μm to 10.8 μm, power of the laser is 0.08 W to 275 W, a focal length of the laser is 600±40 mm, laser-etching lines are filled in one of a parallel-and-same-direction mode, a parallel-and-opposite-direction mode, an arch-like connection mode or a cross connection mode at a filling spacing of 0.008 mm to 0.05 mm, an output power percentage of the laser is 25% to 75%, a frequency of the laser is 10 kHz to 85 kHz, a scanning speed of the laser is 20 mm/s to 8000 mm/s, a scanning operation is performed for once to ten times, and a scanning area is 0.8 cm² to 1024 cm².

It should be appreciated that, a laser-sintered effect is greatly affected by the wavelength, the power, the focal length, the output power percentage, the filling spacing, the scanning speed and the frequency.

In a possible embodiment of the present disclosure, the mesoporous nanocrystalline layer is sintered in the presence of oxygen or ozone at a volume fraction of 45% to 99%.

In a possible embodiment of the present disclosure, the hole blocking layer is formed on the conductive base substrate through spraying, the conductive base substrate is made of one or more selected from the group consisting of conductive glass, a metal oxide, a carbon nanomaterial and a conductive polymer, the hole blocking layer is made of one or more selected from the group consisting of titanium dioxide and aluminium oxide, and the hole blocking layer has a thickness of 1 nm to 50 nm.

In a possible embodiment of the present disclosure, the forming the mesoporous nanocrystalline layer includes applying a mesoporous nanocrystalline layer slurry onto the hole blocking layer through screen printing, and drying the mesoporous nanocrystalline layer slurry to obtain the mesoporous nanocrystalline layer, the mesoporous nanocrystalline layer slurry includes one or more selected from the group consisting of titanium dioxide, tin dioxide, zinc oxide, barium stannate, strontium titanate and nickel oxide, and the mesoporous nanocrystalline layer has a thickness of 10 nm to 8000 nm.

In a possible embodiment of the present disclosure, the forming the insulation interlayer includes applying an insulation interlayer slurry onto the mesoporous nanocrystalline layer through screen printing, and drying the insulation interlayer slurry to obtain the insulation interlayer, the insulation interlayer slurry includes one or more selected from the group consisting of zirconium dioxide, aluminium oxide and silicon dioxide, and the insulation interlayer has a thickness of 1 µm to 100 µm.

In a possible embodiment of the present disclosure, the forming the counter electrode layer includes applying a counter electrode layer slurry onto the insulation interlayer through screen printing, and drying the counter electrode layer slurry to obtain the counter electrode layer, the counter electrode layer slurry includes one or more selected from the group consisting of carbon black, graphite, carbon nanotube, active carbon, graphene and graphyne, the counter electrode layer has a thickness of 1 µm to 100 µm, and the insulation layer and the counter electrode layer are sintered for 30 min to 50 min at a temperature of 300° C. to 400° C.

In another aspect, the present disclosure provides in some embodiments a laser-sintered perovskite solar cell manufactured through the above-mentioned method.

In a possible embodiment of the present disclosure, the laser-sintered perovskite solar cell includes a conductive base substrate, a hole blocking layer, a mesoporous nanocrystalline layer, an insulation interlayer and a counter electrode layer arranged one on another, and perovskite crystals are formed in the mesoporous nanocrystalline layer, the insulation interlayer and the counter electrode layer.

The present disclosure at least has the following beneficial effects.

(1) The method in the embodiments of the present disclosure includes: forming the hole blocking layer on the conductive base substrate; forming the mesoporous nanocrystalline layer on the hole blocking layer, and sintering the mesoporous nanocrystalline layer through a laser beam; forming the insulation interlayer on the mesoporous nanocrystalline layer; forming the counter electrode layer on the insulation interlayer, and sintering the insulation interlayer and the counter electrode layer; and applying the perovskite precursor solution onto the counter electrode layer to obtain the laser-sintered perovskite solar cell. According to the method in the embodiments of the present disclosure, the interfacial adhesion is achieved between mesoporous nanocrystals through an instantaneous high temperature generated by the laser, so as to provide a lattice connection structure between the grains. In addition, the slurry does not contain any solvent or organic binding agent, so as to prepare the mesoporous film with a large area within a very short time period, thereby to remarkably reduce the power consumption, reduce the processing time, improve the preparation efficiency and the reproducibility, reduce the requirement on the processing environment, and facilitate the manufacture of a large-area and flexible element.

To be specific, a high-energy laser beam is generated using relatively low energy, and the energy utilization is high. It takes no preheating time and preparation time to generate and cut off the laser beam, and the mesoporous film is sintered sufficiently within a very short time due to the instantaneous high temperature of the laser beam, so it is able to remarkably reduce the processing time. The laser beam is outputted stably and generated rapidly, so it is able to ensure the reproducibility of the product. A conventional high-temperature heating stage is not used, so it is able to reduce the requirements on the temperature and humidity during the manufacture, and facilitate the manufacture of the element with a flexible base substrate at a low temperature. The laser beam is highly concentrated, so it is able to improve the processing accuracy of the thin film. The laser sintering, as a non-contact method, is clean, power-saving, time-saving and efficient, so it is able to prevent the occurrence of any contaminants.

(2) According to the method in the embodiments of the present disclosure, the grains in the mesoporous nanocrystalline layer are sintered rapidly to be in an oxygen-deficient state (metallized), so it is able to increase an electron cloud density of the grains, and improve the transfer of the carriers.

(3) According to the method in the embodiments of the present disclosure, when the mesoporous nanocrystalline layer is made of titanium dioxide, the grain is not fully melted during the scanning, so the grain is provided with a solidified body (in the oxygen-deficient state) including a non-melted nucleus structure (in a crystallization state), and thereby it is able to adjust energy level positions of the grain. When oxygen or ozone is introduced, an oxygen/ozone partial pressure is controlled in such a manner that an outermost layer of the nucleus structure returns to an initial crystallization state, so as to change the distribution of the oxygen-deficient states in a shell of the grain. In this way, it is able to provide the grain with a multi-layer shell structure including an internal layer in the crystallization state, an intermediate layer in the oxygen-deficient state and an outer layer in the crystallization state.

(4) According to the method in the embodiments of the present disclosure, the penetrability of the laser beam is low, the laser sintering is selective to a to-be-sintered object, and different substances have different capabilities of absorbing a laser beam at a specific wavelength, so it is able to sinter he mesoporous nanocrystalline layer at a specific region through parameter adjustment. A lower thin film is not adversely affected when an upper thin film is sintered, so as to facilitate the formation of the three mesoporous film layers of the solar cell. In addition, the grains are fused and adhered through the high-energy laser beam (an external crystallization state), so it is able to improve the extraction and transmission of the electrons at the mesoporous nanocrystalline layer, thereby to facilitate the transfer of the carriers. Through spot scanning, each thin film is provided with a wavelike surface, so it is able to achieve a three-dimensional contact between the thin films and improve the extraction and transmission of the electrons in the mesoporous nanocrystalline layer, thereby to provide the mesoporous nanocrystalline layer with a high mesoporous property and high conductivity, and improve the working efficiency of the element.

(5) According to the method in the embodiments of the present disclosure, during the laser sintering, due to unique anisotropic contraction of the semiconductor material, it is able to reduce a residual stress in the thin film as well as a thickness of the thin film, thereby to remarkably increase the porosity of the thin film, and improve the filling and adhesion of perovskite materials.

(6) According to the method in the embodiments of the present disclosure, the insulation interlayer and the counter electrode layer are sintered through the laser beam, so it is able to obtain the flexible perovskite solar cell at a low temperature.

REFERENCE SIGN LIST 1 conductive base substrate
2 hole blocking layer
3 mesoporous nanocrystalline layer
4 insulation interlayer
5 counter electrode layer

DETAILED DESCRIPTION

The present disclosure will be described hereinafter in conjunction with the drawings and embodiments. The following embodiments are for illustrative purposes only, but shall not be used to limit the scope of the present disclosure. Actually, the embodiments are provided so as to facilitate the understanding of the scope of the present disclosure.

Example 1

The present disclosure provides a method for manufacturing a laser-sintered perovskite solar cell, which includes the following steps.

(1) A conductive base substrate is placed onto a high-temperature heating stage, and heated to 450° C. Then, a hole blocking layer is formed on the conductive base substrate through spraying. The conductive base substrate is a Fluorine-doped Tin Oxide (FTO) glass substrate, and the hole blocking layer is made of titanium dioxide and has a thickness of 1 nm.

(2) A mesoporous nanocrystalline layer is formed on the hole blocking layer. To be specific, a mesoporous nanocrystalline layer slurry is printed onto the hole blocking layer, and dried to obtain the mesoporous nanocrystalline layer. Then, the mesoporous nanocrystalline layer is sintered through a laser beam in the presence of oxygen at a volume fraction of 45%.

The mesoporous nanocrystalline layer slurry is titanium dioxide, a wavelength of the laser beam is 9.2 μm, power of a laser is 275 W, a focal length of the laser is 600±40 mm, laser-etching lines are filled in a parallel-and-same-direction mode at a filling spacing of 0.008 mm, an output power percentage of the laser is 25%, a frequency of the laser is 60 kHz, a scanning speed of the laser is 3000 mm/s, a scanning operation is performed for twice, and a scanning area is 0.8 $cm^2$.

It should be appreciated that, the laser sintering is performed through one of an ultraviolet laser, an infrared laser or a visible-light laser. In the embodiments of the present disclosure, the filling mode of the laser-etching lines, the quantity of times of the scanning operations and the scanning area will not be particularly defined herein.

(3) An insulation interlayer is formed on the mesoporous nanocrystalline layer. To be specific, an insulation interlayer slurry is applied onto the mesoporous nanocrystalline layer through printing, and then dried to form the insulation interlayer. The insulation interlayer slurry is zirconium dioxide.

(4) A counter electrode layer is formed on the insulation interlayer. To be specific, a counter electrode layer slurry is applied onto the insulation interlayer and dried. Then, the insulation interlayer and the counter electrode layer are sintered for 50 min at a temperature of 300° C., so as to provide the insulation interlayer and the counter electrode layer with a mesoporous structure.

The counter electrode layer slurry is a mixture of carbon black and graphite at a mass ratio of 1:1.

(5) A perovskite precursor solution is applied onto the counter electrode layer. The perovskite precursor solution enters the mesoporous nanocrystalline, the insulation layer and the counter electrode layer each with the mesoporous structure due to a capillary effect, and grows to obtain the laser-sintered perovskite solar cell.

A solute of the perovskite precursor solution is expressed as $ABX_3$, where A represents methylamine, B represents plumbum, and X represents iodine.

Figure 1:
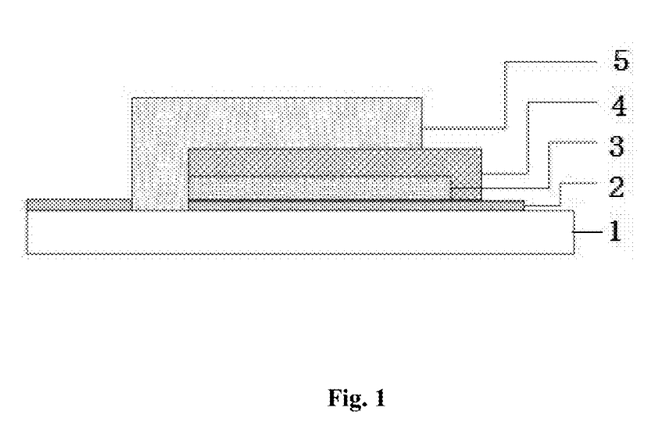
FIG. 1 is a schematic view showing a laser-sintered perovskite solar cell according to one embodiment of the present disclosure.

As shown in FIG. 1, the laser-sintered perovskite solar cell obtained through the above-mentioned method includes the conductive base substrate 1, the hole blocking layer 2, the mesoporous nanocrystalline layer 3, the insulation interlayer 4 and the counter electrode layer 5 arranged one on another, and perovskite grains are provided in the mesoporous structure in each of the mesoporous nanocrystalline layer, the insulation interlayer and the counter electrode layer.

Example 2

The present disclosure provides a method for manufacturing a laser-sintered perovskite solar cell, which includes the following steps.

(1) A conductive base substrate is placed onto a high-temperature heating stage, and heated to 450° C. Then, a hole blocking layer is formed on the conductive base substrate through spraying. The conductive base substrate is an Indium Tin Oxide (ITO) glass substrate, and the hole blocking layer is made of aluminium oxide.

(2) A mesoporous nanocrystalline layer is formed on the hole blocking layer. To be specific, a mesoporous nanocrystalline layer slurry is applied onto the hole blocking layer through screen printing, and dried to obtain the mesoporous nanocrystalline layer. Then, the mesoporous nanocrystalline layer is sintered through a laser beam in the presence of ozone at a volume fraction of 99%.

The mesoporous nanocrystalline layer slurry is titanium dioxide, a wavelength of the laser beam is 10.8 μm, power of a laser is 0.08 W, a focal length of the laser is 600±40 mm, laser-etching lines are filled in a parallel-and-same-direction mode at a filling spacing of 0.05 mm, an output power percentage of the laser is 35%, a frequency of the laser is 20 kHz, a scanning speed of the laser is 3000 mm/s, a scanning operation is performed for ten times, and a scanning area is 1024 cm².

It should be appreciated that, the laser sintering is performed through one of an ultraviolet laser, an infrared laser or a visible-light laser.

(3) An insulation interlayer is formed on the mesoporous nanocrystalline layer. To be specific, an insulation interlayer slurry is applied onto the mesoporous nanocrystalline layer through screen printing, and then dried to form the insulation interlayer. The insulation interlayer slurry is aluminium oxide.

(4) A counter electrode layer is formed on the insulation interlayer. To be specific, a counter electrode layer slurry is applied onto the insulation interlayer and dried. Then, the insulation interlayer and the counter electrode layer are sintered for 30 min at a temperature of 400° C., so as to provide the insulation interlayer and the counter electrode layer with a mesoporous structure.

The counter electrode layer slurry is a mixture of active carbon and graphite at a mass ratio of 2:1.

(5) A perovskite precursor solution is applied onto the counter electrode layer. The perovskite precursor solution enters the mesoporous nanocrystalline, the insulation layer and the counter electrode layer each with the mesoporous structure due to a capillary effect, and grows to obtain the laser-sintered perovskite solar cell.

A solute of the perovskite precursor solution is expressed as $ABX_3$, where A represents formamidine, B represents plumbum, and X represents iodine.

Example 3

The present disclosure provides a method for manufacturing a laser-sintered perovskite solar cell, which includes the following steps.

(1) A conductive base substrate is placed onto a high-temperature heating stage, and heated to 450° C. Then, a hole blocking layer is formed on the conductive base substrate through spraying. The conductive base substrate is an FTO glass substrate, and the hole blocking layer is made of titanium dioxide.

(2) A mesoporous nanocrystalline layer is formed on the hole blocking layer. To be specific, a mesoporous nanocrystalline layer slurry is applied onto the hole blocking layer through screen printing, and dried to obtain the mesoporous nanocrystalline layer. Then, the mesoporous nanocrystalline layer is sintered through a laser beam in the presence of oxygen at a volume fraction of 72%.

The mesoporous nanocrystalline layer slurry is zinc oxide, a wavelength of the laser beam is 0.35 μm, power of a laser is 142 W, a focal length of the laser is 600±40 mm, laser-etching lines are filled in an arch-like connection mode at a filling spacing of 0.03 mm, an output power percentage of the laser is 45%, a frequency of the laser is 50 kHz, a scanning speed of the laser is 4000 mm/s, a scanning operation is performed for five times, and a scanning area is 512 cm².

It should be appreciated that, the laser sintering is performed through one of an ultraviolet laser, an infrared laser or a visible-light laser.

(3) An insulation interlayer is formed on the mesoporous nanocrystalline layer. To be specific, an insulation interlayer slurry is applied onto the mesoporous nanocrystalline layer through screen printing, and then dried to form the insulation interlayer. The insulation interlayer slurry is silicon dioxide.

(4) A counter electrode layer is formed on the insulation interlayer. To be specific, a counter electrode layer slurry is applied onto the insulation interlayer through screen printing and dried. Then, the insulation interlayer and the counter electrode layer are sintered for 40 min at a temperature of 350° C., so as to provide the insulation interlayer and the counter electrode layer with a mesoporous structure.

The counter electrode layer slurry is a mixture of carbon black and graphite at a mass ratio of 1:3.

(5) A perovskite precursor solution is applied onto the counter electrode layer. The perovskite precursor solution enters the mesoporous nanocrystalline, the insulation layer and the counter electrode layer each with the mesoporous structure due to a capillary effect, and grows to obtain the laser-sintered perovskite solar cell.

A solute of the perovskite precursor solution is expressed as $ABX_3$, where A represents cesium, B represents plumbum, and X represents chlorine.

Example 4

The present disclosure provides a method for manufacturing a laser-sintered perovskite solar cell, which includes the following steps.

(1) A conductive base substrate is placed onto a high-temperature heating stage, and heated to 450° C. Then, a hole blocking layer is formed on the conductive base substrate through spraying. The conductive base substrate is an FTO glass substrate, and the hole blocking layer is made of titanium dioxide.

(2) A mesoporous nanocrystalline layer is formed on the hole blocking layer. To be specific, a mesoporous nanocrystalline layer slurry is applied onto the hole blocking layer through screen printing using a 200-mesh screen, and dried to obtain the mesoporous nanocrystalline layer. Then, the mesoporous nanocrystalline layer is sintered through a laser beam in the presence of oxygen at a volume fraction of 72%.

The mesoporous nanocrystalline layer slurry is titanium dioxide, a wavelength of the laser beam is 10 μm, power of a laser is 142 W, a focal length of the laser is 600±40 mm, laser-etching lines are filled in an arch-like connection mode at a filling spacing of 0.03 mm, an output power percentage of the laser is 50%, a frequency of the laser is 50 kHz, a scanning speed of the laser is 1000 mm/s, a scanning operation is performed for three times, and a scanning area is 1.3 cm².

It should be appreciated that, the laser sintering is performed through one of an ultraviolet laser, an infrared laser or a visible-light laser.

(3) An insulation interlayer is formed on the mesoporous nanocrystalline layer. To be specific, an insulation interlayer slurry is applied onto the mesoporous nanocrystalline layer through screen printing, and then dried to form the insulation interlayer. The insulation interlayer slurry is zirconium dioxide.

(4) A counter electrode layer is formed on the insulation interlayer. To be specific, a counter electrode layer slurry is applied onto the insulation interlayer through screen printing and dried. Then, the insulation interlayer and the counter electrode layer are sintered for 40 min at a temperature of 350° C., so as to provide the insulation interlayer and the counter electrode layer with a mesoporous structure.

The counter electrode layer slurry is a mixture of carbon black, graphite and active carbon at a mass ratio of 1:3:1.

(5) A perovskite precursor solution is applied onto the counter electrode layer. The perovskite precursor solution enters the mesoporous nanocrystalline, the insulation layer and the counter electrode layer each with the mesoporous structure due to a capillary effect, and grows to obtain the laser-sintered perovskite solar cell.

A solute of the perovskite precursor solution is expressed as $ABX_3$, where A represents methylamine, B represents plumbum, and X represents iodine.

Figure 3:
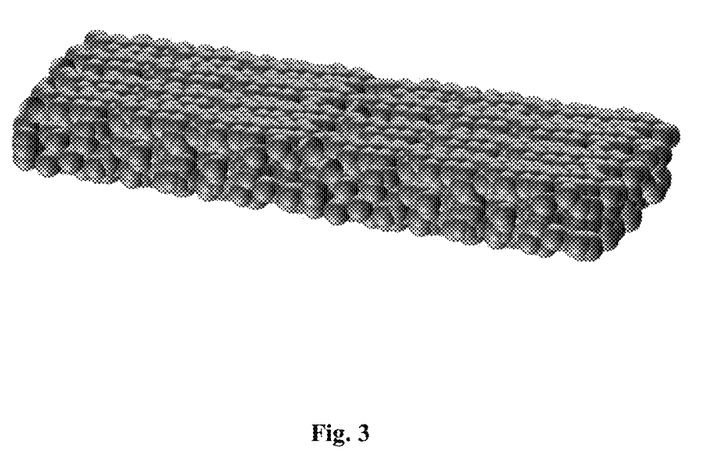
FIG. 3 is a partial enlarged view of a mesoporous nanocrystalline layer of the laser-sintered perovskite solar cell in Example 1.
Figure 4:
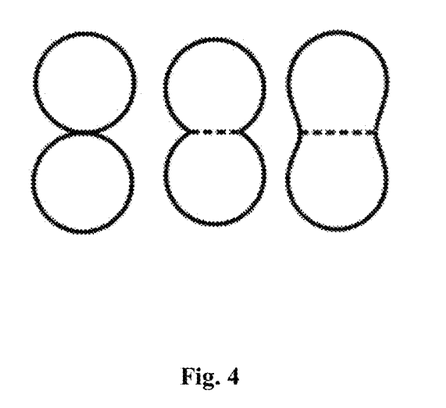
FIG. 4 is a partial enlarged view of particles in the mesoporous nanocrystalline layer of the laser-sintered perovskite solar cell in Example 1.

FIG. 3 is a partial enlarged view of the mesoporous nanocrystalline layer of the laser-sintered perovskite solar cell, and FIG. 4 is a partial enlarged view of grains in the mesoporous nanocrystalline layer of the laser-sintered perovskite solar cell.

Example 5

The method in Example 5 differs from that in Example 4 merely in that the hole blocking layer is directly formed on the conductive base substrate without any high-temperature heating stage, and then the laser sintering is performed.

For the method in Example 5, a wavelength of the laser beam is 10 μm, power of a laser is 142 W, a focal length of the laser is 600±40 mm, laser-etching lines are filled in an arch-like connection mode at a filling spacing of 0.03 mm, an output power percentage of the laser is 50%, a frequency of the laser is 50 kHz, a scanning speed of the laser is 1000 mm/s, a scanning operation is performed for three times, and a scanning area is 1.3 $cm^2$.

Example 6

The method in Example 6 differs from that in Example 4 merely in that the insulation interlayer and the counter electrode layer are sintered through the laser beam rather than being sintered at a high temperature, so as to obtain the mesoporous structure.

For the method in Example 6, a wavelength of the laser beam is 10 μm, power of a laser is 142 W, a focal length of the laser is 600±40 mm, laser-etching lines are filled in an arch-like connection mode at a filling spacing of 0.03 mm, an output power percentage of the laser is 50%, a frequency of the laser is 50 kHz, a scanning speed of the laser is 1000 mm/s, a scanning operation is performed for three times, and a scanning area is 1.3 $cm^2$.

Example 7

The method in Example 7 differs from that in Example 4 merely in that the laser sintering is adopted (1) and (4).

In Example 7, the laser sintering in (1) is identical to that in (1) in Example 5, and the laser sintering in (4) is identical to that in (4) in Example 6.

Example 8

The method in Example 7 differs from that in Example 4 merely in that the conductive base substrate is made of poly(3,4-ethylenedioxythiophene) poly(styrenesulfonate) (PEDOT:PSS).

Comparative Example 1

A method for manufacturing a perovskite solar cell in Comparative Example 1 differs from that in Example 4 merely in that the mesoporous nanocrystalline layer is not sintered through the laser beam.

To be specific, the mesoporous nanocrystalline layer is directly formed on the hole blocking layer through screen printing, and then dried.

Comparative Example 2

A method for manufacturing a perovskite solar cell in Comparative Example 2 differs from that in Example 4 merely in that the mesoporous nanocrystalline layer is sintered at a high temperature rather than being sintered through the laser beam.

To be specific, the mesoporous nanocrystalline layer is formed on the hole blocking layer through screen printing and dried. Then, the mesoporous nanocrystalline layer is sintered at a temperature of 500° C. for 45 min.

Figure 2:
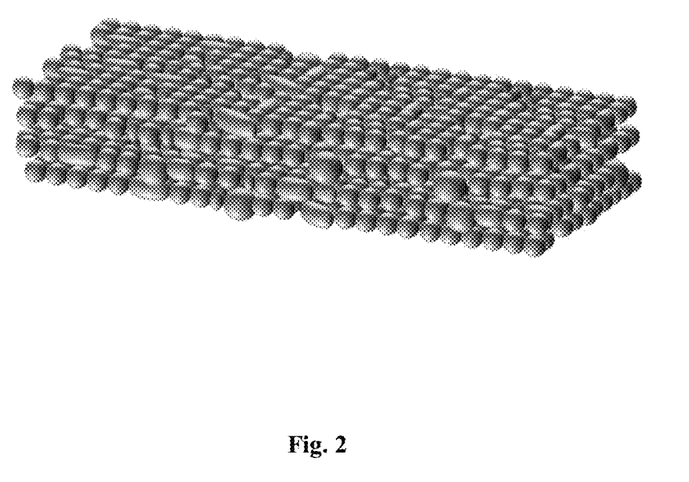
FIG. 2 is a partial enlarged view of a mesoporous nanocrystalline layer of a perovskite solar cell sintered through a high-temperature heating stage in comparative example 2.

FIG. 2 is a partial enlarged view of the mesoporous nanocrystalline layer in the perovskite solar cell in Comparative Example 2. As shown in FIGS. 2 and 3, the titanium dioxide grains in FIG. 3 are fused in a better manner than those in FIG. 2, so it is able to improve the conductivity and facilitate the charge transfer. In other words, through the laser sintering, it is able to improve the adhesion between the interfaces of the grains, thereby to achieve the electrical interconnection between the grains in a better manner. In addition, when the titanium dioxide grains are fused in a better manner, it also means that the solvent and organic binding agent in the slurry are eliminated in a better manner during the sintering.

Effect Contrast Example

The following experiment is conducted so as to validate the technical effects of the method in the embodiments of the present disclosure.

J-V curves (current density-voltage curves) of the laser-sintered perovskite solar cells in Examples 1-8 and Comparative Examples 1-2 are simulated at a room temperature of 25° C., a light intensity of 100 $mW/cm^{-2}$ and AM1.5, and then open-circuit voltages (Voc/V), short-circuit photocurrent (Jsc/mA·$cm^{-2}$), filling factors (FF) and photoelectric conversion efficiency (η/%) are obtained in accordance with the J-V curves.

The following results are shown in the experiment.

| Serial number | Voc/V | Jsc/mA · $cm^{-2}$ | FF | η/% |
| --- | --- | --- | --- | --- |
| Example 1 | 0.91 | 21.06 | 76.59 | 14.69 |
| Example 2 | 0.92 | 20.93 | 74.47 | 14.37 |
| Example 3 | 0.92 | 21.17 | 78.34 | 15.27 |
| Example 4 | 0.96 | 20.90 | 76.6 | 15.45 |
| Example 5 | 0.94 | 21.72 | 75.77 | 15.58 |
| Example 6 | 0.95 | 21.11 | 78.99 | 15.89 |
| Example 7 | 0.96 | 20.96 | 78.84 | 15.92 |
| Example 8 | 0.79 | 19.54 | 0.45 | 6.83 |
| Comparative Example 1 | 0.91 | 16.96 | 65.97 | 10.13 |
| Comparative Example 2 | 0.90 | 20.27 | 74.53 | 13.61 |

Through comparing Examples 1-4 with Comparative Examples 1-2, when the mesoporous nanocrystalline layer is sintered through the laser beam, it is able to remarkably improve the photoelectric conversion efficiency of the perovskite solar cell. Based on Examples 4-6, when the hole blocking layer, the insulation interlayer and the counter electrode layer, apart from the mesoporous nanocrystalline layer, are sintered through the laser beam, it is also able to improve the photoelectric conversion efficiency of the perovskite solar cell to some extent. Through comparing Example 8 with Comparative Examples 1-2, it is able to manufacture an all-laser-sintered, flexible perovskite solar cell.

The above embodiments are for illustrative purposes only, but the present disclosure is not limited thereto. Obviously, a person skilled in the art may make further modifications and improvements according to the embodiments of the present disclosure, and these modifications and improvements shall also fall within the scope of the present disclosure.

What is claimed is:

1. A method for manufacturing a laser-sintered perovskite solar cell, comprising:

forming a hole blocking layer on a conductive base substrate;

forming a mesoporous nanocrystalline layer on the hole blocking layer, and sintering the mesoporous nanocrystalline layer through a laser beam;

forming an insulation interlayer on the mesoporous nanocrystalline layer;

forming a counter electrode layer on the insulation interlayer, and sintering the insulation layer and the counter electrode layer; and applying a perovskite precursor solution on the counter electrode layer to obtain the laser-sintered perovskite solar cell;

wherein the mesoporous nanocrystalline layer is sintered in presence of oxygen or ozone at a volume fraction of 45% to 99%;

wherein the mesoporous nanocrystalline layer is made of titanium dioxide; an oxygen/ozone partial pressure is controlled in such a manner that the mesoporous nanocrystalline layer forming a grain with a multi-layer shell structure including an internal layer in the crystallization state, an intermediate layer in the oxygen-deficient state and an outer layer in the crystallization state;

wherein the laser beam sintering is carried out by through spot scanning, so that each thin film is provided with a wavelike surface;

wherein the hole blocking layer, the insulation interlayer and the counter electrode layer are sintered through the laser beam.

2. The method according to claim 1, wherein the mesoporous nanocrystalline layer is sintered through one of an ultraviolet laser, an infrared laser or a visible-light laser.

3. The method according to claim 2, wherein a wavelength of the laser beam is 0.35 μm to 10.8 μm, power of the laser is 0.08 W to 275 W, a focal length of the laser is 600±40 mm, laser-etching lines are filled in one of a parallel-and-same-direction mode, a parallel-and-opposite-direction mode, an arch-like connection mode or a cross connection mode at a filling spacing of 0.008 mm to 0.05 mm, an output power percentage of the laser is 25% to 75%, a frequency of the laser is 10 kHz to 85 kHz, a scanning speed of the laser is 20 mm/s to 8000 mm/s, a scanning operation is performed for once to ten times, and a scanning area is 0.8 $cm^2$ to 1024 $cm^2$.

4. The method according to claim 1, wherein the hole blocking layer is formed on the conductive base substrate through spraying, the conductive base substrate is made of one or more selected from a group consisting of conductive glass, a metal oxide, a carbon nanomaterial and a conductive polymer, the hole blocking layer is made of one or more selected from a group consisting of titanium dioxide and aluminium oxide, and the hole blocking layer has a thickness of 1 nm to 50 nm.

5. The method according to claim 1, wherein the forming the mesoporous nanocrystalline layer comprises applying a mesoporous nanocrystalline layer slurry onto the hole blocking layer through screen printing, and drying the mesoporous nanocrystalline layer slurry to obtain the mesoporous nanocrystalline layer, the mesoporous nanocrystalline layer slurry comprises one or more selected from a group consisting of titanium dioxide, tin dioxide, zinc oxide, barium stannate, strontium titanate and nickel oxide, and the mesoporous nanocrystalline layer has a thickness of 10 nm to 8000 nm.

6. The method according to claim 1, the forming the insulation interlayer comprises applying an insulation interlayer slurry onto the mesoporous nanocrystalline layer through screen printing, and drying the insulation interlayer slurry to obtain the insulation interlayer, the insulation interlayer slurry comprises one or more selected from a group consisting of zirconium dioxide, aluminium oxide and silicon dioxide, and the insulation interlayer has a thickness of 1 μm to 100 μm.

7. The method according to claim 1, wherein the forming the counter electrode layer comprises applying a counter electrode layer slurry onto the insulation interlayer through screen printing, and drying the counter electrode layer slurry to obtain the counter electrode layer, the counter electrode layer slurry comprises one or more selected from a group consisting of carbon black, graphite, carbon nanotube, active carbon, graphene and graphyne, the counter electrode layer has a thickness of 1 μm to 100 μm, and the insulation layer and the counter electrode layer are sintered for 30 min to 50 min at a temperature of 300° C. to 400° C.

* * * * *